US008963420B2

(12) United States Patent
Lee

(10) Patent No.: US 8,963,420 B2
(45) Date of Patent: Feb. 24, 2015

(54) ORGANIC ELECTRO-LUMINESCENCE DISPLAY PANEL FOR PREVENTING THE DISPLAY PANEL FROM DEGRADING AND A METHOD FOR FABRICATING THE SAME

(75) Inventor: Seung-Hwan Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 329 days.

(21) Appl. No.: 13/426,838

(22) Filed: Mar. 22, 2012

(65) Prior Publication Data

US 2013/0048954 A1  Feb. 28, 2013

(30) Foreign Application Priority Data

Aug. 29, 2011  (KR) .................. 10-2011-0086753
Feb. 17, 2012  (KR) .................. 10-2012-0016418

(51) Int. Cl.
| H05B 33/00 | (2006.01) |
| H01L 27/32 | (2006.01) |
| H01L 51/52 | (2006.01) |
| H01L 51/56 | (2006.01) |

(52) U.S. Cl.
CPC ........ *H01L 27/3211* (2013.01); *H01L 51/5221* (2013.01); *H01L 51/56* (2013.01); *H01L 27/3244* (2013.01)
USPC .............................. 313/506; 445/23; 313/504

(58) Field of Classification Search
CPC ............ H01L 51/5012; H01L 51/5237; H01L 27/3244
USPC ................... 313/504, 506, 512; 445/23–25
See application file for complete search history.

(56) References Cited

U.S. PATENT DOCUMENTS

| 7,579,774 B2 | 8/2009 | Yamazaki et al. |
| 7,586,171 B2 | 9/2009 | Cao et al. |
| 2005/0156513 A1 | 7/2005 | Sano et al. |

FOREIGN PATENT DOCUMENTS

| CN | 1567610 A | 1/2005 |
| CN | 1645975 A | 7/2005 |
| CN | 101533852 A | 9/2009 |
| FR | 2 728 082 A1 | 6/1996 |
| JP | 2009-259510 A | 11/2009 |
| KR | 10-2005-0015366 A | 2/2005 |
| KR | 10-0504512 B1 | 8/2005 |
| KR | 10-0688366 B1 | 3/2007 |
| TW | 294842 B | 1/1997 |
| TW | 569166 B | 1/2004 |
| TW | 200742486 B | 11/2007 |

OTHER PUBLICATIONS

Taiwan Advance Patent and Trademark Office, Examination Report, Taiwan Patent Application No. 101113858, Sep. 24, 2014, ten pages.
State Intellectual Property Office of the People's Republic of China, First Office Action, Chinese Patent Application No. 201210114878. 9, Oct. 27, 2014, twenty-seven pages.

*Primary Examiner* — Joseph L Williams
(74) *Attorney, Agent, or Firm* — Fenwick & West LLP

(57) ABSTRACT

An organic electro-luminescence display panel and a method for fabricating the same is described which can prevent the display panel from degrading. The organic electro-luminescence display panel includes a drive thin film transistor formed on a substrate, a first electrode connected to the drive thin film transistor, a bank insulating film having a bank hole formed therein for exposing the first electrode, organic common layers having a plurality of common layers stacked in the bank hole, and a second electrode formed on the organic common layers, wherein the plurality of organic common layers are have stacked positions different from one another such that their side edges form a stair shape on both sides.

18 Claims, 18 Drawing Sheets

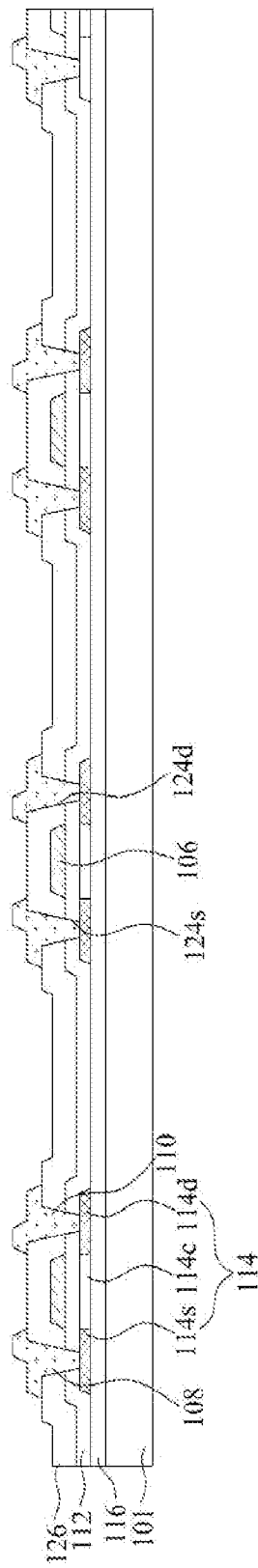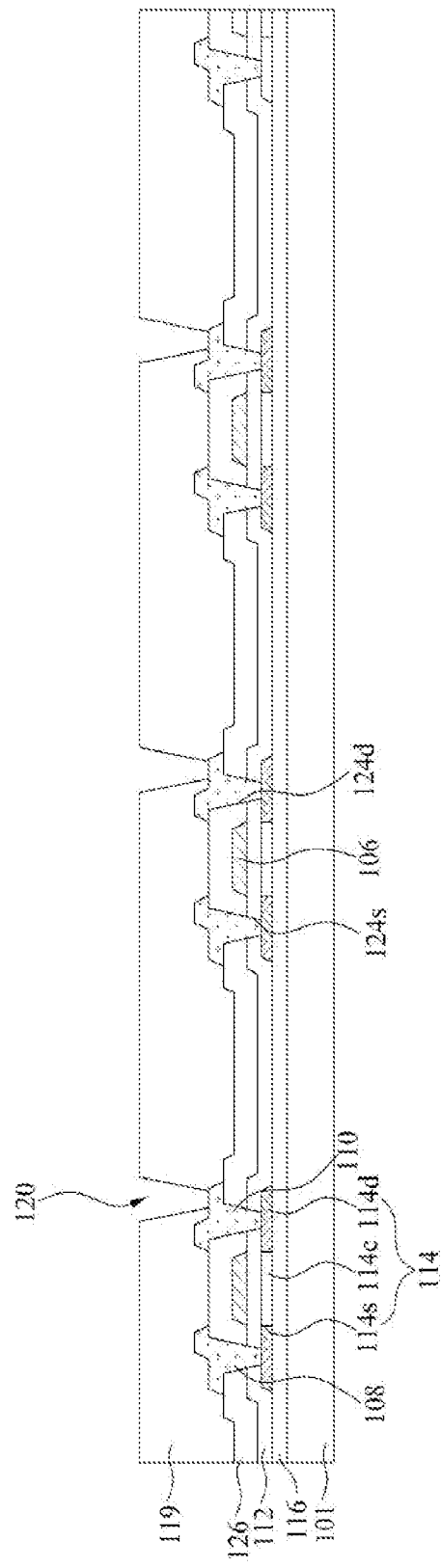

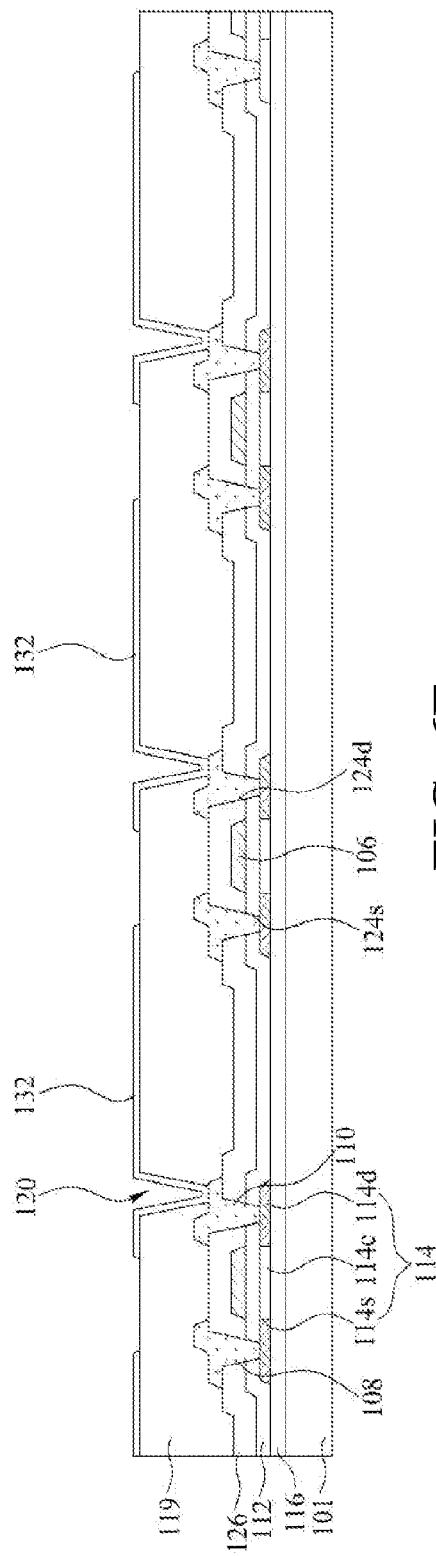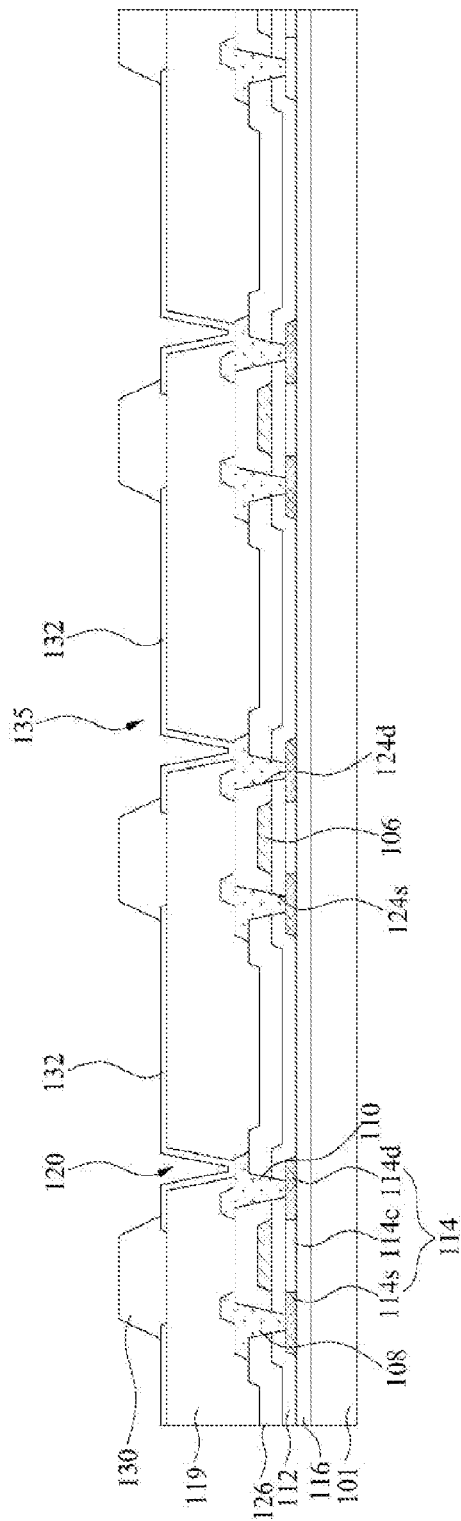
FIG. 6F
FIG. 6G

ORGANIC ELECTRO-LUMINESCENCE DISPLAY PANEL FOR PREVENTING THE DISPLAY PANEL FROM DEGRADING AND A METHOD FOR FABRICATING THE SAME

CROSS REFERENCE TO RELATED APPLICATION

This application claims the benefit under 35 U.S.C. 119(a) of Korean Patent Application No. 10-2011-0086753, filed on Aug. 29, 2011, and Korean Patent Application No. 10-2012-0016418, filed on Feb. 17, 2012, which are hereby incorporated by reference as if fully set forth herein.

BACKGROUND OF THE DISCLOSURE

1. Field of the Disclosure

The present invention relates to an organic electro-luminescence display panel, and more particularly to an organic electro-luminescence display panel and a method for fabricating the same which can prevent the display panel from degrading.

2. Discussion of the Related Art

A display device displaying various information is developed in a direction of providing a thinner, lighter, portable and high performance. According to this, the organic electro-luminescence display device and the like which can reduce weight and volume that is a disadvantage of a cathode ray tube (CRT) are spotlighted. The Organic Light Emitting Device (OLED), a spontaneous emission device which has a thin light emission layer between electrodes, has an advantage of enabling to fabricate a display device as thin as a sheet of paper. In the OLEDs, there are an active matrix OLED (AMOLED) and a passive matrix OLED (PMOLED).

In this instance, the active matrix OLED (AMOLED) has a matrix of pixels each with three color subpixels of R, G, B for displaying a picture. Each of the subpixels has an organic electro-luminescence device, and a cell driver for driving the organic electro-luminescence device. The cell driver has a gate line for supplying a scan signal, a data line for supplying a video data signal, a common power line for supplying a common power signal, at least two thin film transistors and a storage capacitor.

The organic electro-luminescence device has an anode, a cathode and common layers between the anode and the cathode. The common layers include a hole transport layer HTL, a hole injection layer HIL, a light emitting layer, an electron injection layer EIL, and an electron transport layer ETL. As shown in FIG. 1, the common layers are stacked at the same position in succession.

If the cathode 10 is deposited on the substrate including the common layers, the cathode 10 has a flat uniform thickness at a front surface B of the common layers, but the cathode 10 has a non-uniform thickness at side surfaces A of the common layers due to a step coverage of the common layers. Thus, though the cathode 10 deposited on the front surface B has the even thickness, since the cathode 10 deposited on the side A has an uneven thickness, varying resistance of the cathode 10 with positions thereof, degradation of the display device takes place.

SUMMARY OF THE DISCLOSURE

An organic electro-luminescence display panel and a method for fabricating the same is described that can prevent the display panel from degrading. To this and other advantages and in accordance with the purpose of the invention, as embodied and broadly described herein, an organic electro-luminescence display panel includesf a drive thin film transistor formed on a substrate, a first electrode connected to the drive thin film transistor, a bank insulating film having a bank hole formed therein for exposing the first electrode, organic common layers having a plurality of common layers stacked in the bank hole, and a second electrode formed on the organic common layers, wherein the plurality of organic common layers are formed in a staggered fashion so that together the sides edges of the organic common layers form a stair shape. In one embodiment, the plurality of organic common layers are formed using a shadow mask.

In one embodiment, the plurality of organic common layers include first through fifth common layers, wherein the first common layer is a hole injection layer (HIL), the second common layer is a hole transport layer (HTL), the third common layer is a Red, Green, or Blue light emission layer (EML), the fourth common layer is an electron transport layer (ETL), and the fifth common layer is an electron injection layer (EIL). The organic electro-luminescence display panel may further include a buffer film formed between the first electrode and the organic common layers.

The organic common layers form a stair shape, In one embodiment, the organic common layers are contained within a subpixel region such that each subpixel region has a stack of organic common layers in a stair shape. In other embodiments, the first, second, fourth and fifth common layers form the stair shape, and extend across multiple subpixel regions. Depending upon the embodiment, the third organic common layer may either also extend across multiple subpixel regions, or alternatively may be contained within a subpixel region such that each subpixel region has its own third organic common layer.

In one embodiment, the first common layer is stacked on the first electrode. The second common layer has one side edge positioned a distance in a left direction from a left side edge of the first common layer, so that the second common layer envelops the first common layer on the left side. The third common layer is positioned a distance in a right direction from the right side edges of the first and second common layers, so that the third common layer envelops the first and second common layers on their right sides. The fourth common layer is positioned a distance in the left direction from the left side edges of the second and third common layers so that the fourth common layer envelops the second and third common layers on their left sides. The fifth common layer is positioned a distance in the right direction from the right side edges of the third and fourth common layers so that the fifth common layer envelops the third and fourth common layers on their right sides. In one embodiment, the left side edges of the second and fourth common layers extend 10~50 µm in the left direction from the left edge of the first common layer. The right side edges of the third and fifth common layers extend 10~50 µm in the right direction from the right edge of the first common layer.

In one embodiment, the second common layer has a right (or "inside") edge positioned a distance in a left direction from a right edge of the first common layer. The third common layer has a left (or "inside") edge positioned a distance in a right direction from the left side edge of the first common layer. The fourth common layer has a right edge positioned a distance in the left direction from the right edge of the first common layer The fifth common layer has a left edge positioned a distance in the right direction from the left edge of the first common layer.

In another embodiment, the side edges on a left side of the organic common layers each envelop the left side edge of the layer beneath, and the right side edges on the right side of the organic common layers each extend past the right side edge of the layer above. In other embodiments, other patterns are envisioned for which side edges extend past or envelop the other side edges of the other organic common layers.

The choice of right and left positioning of the organic common layers is arbitrary, and may be reversed in another embodiment.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIGS. 6A through 6H illustrate sections showing the steps of a method for fabricating an organic electro-luminescence display panel in accordance with one embodiment.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts. It will be paid attention to that detailed description of known arts may be omitted if it is determined that the description can lead to misunderstanding of the present invention.

First Embodiment

A preferred embodiment of the present invention will be described with reference to FIGS. 2 to 7E.

Figure 2:
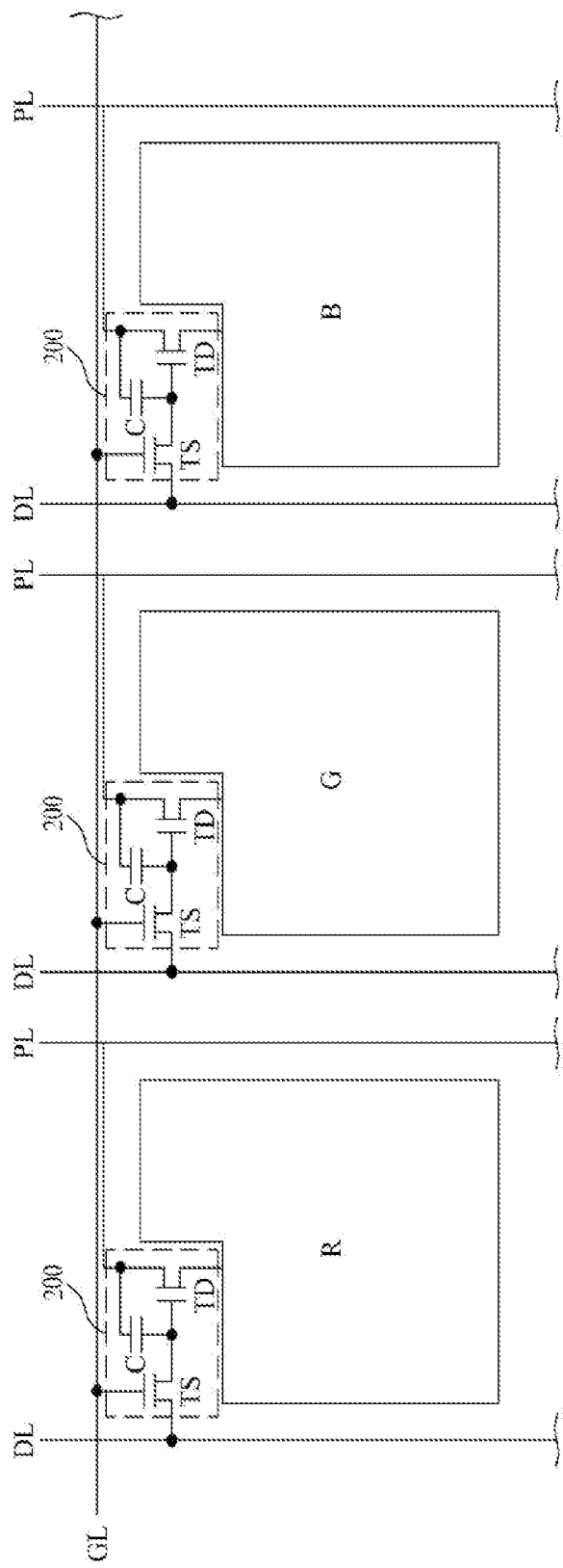
FIG. 2 illustrates an equivalent circuit of an R,G,B subpixel region in accordance with one embodiment.
Figure 3:
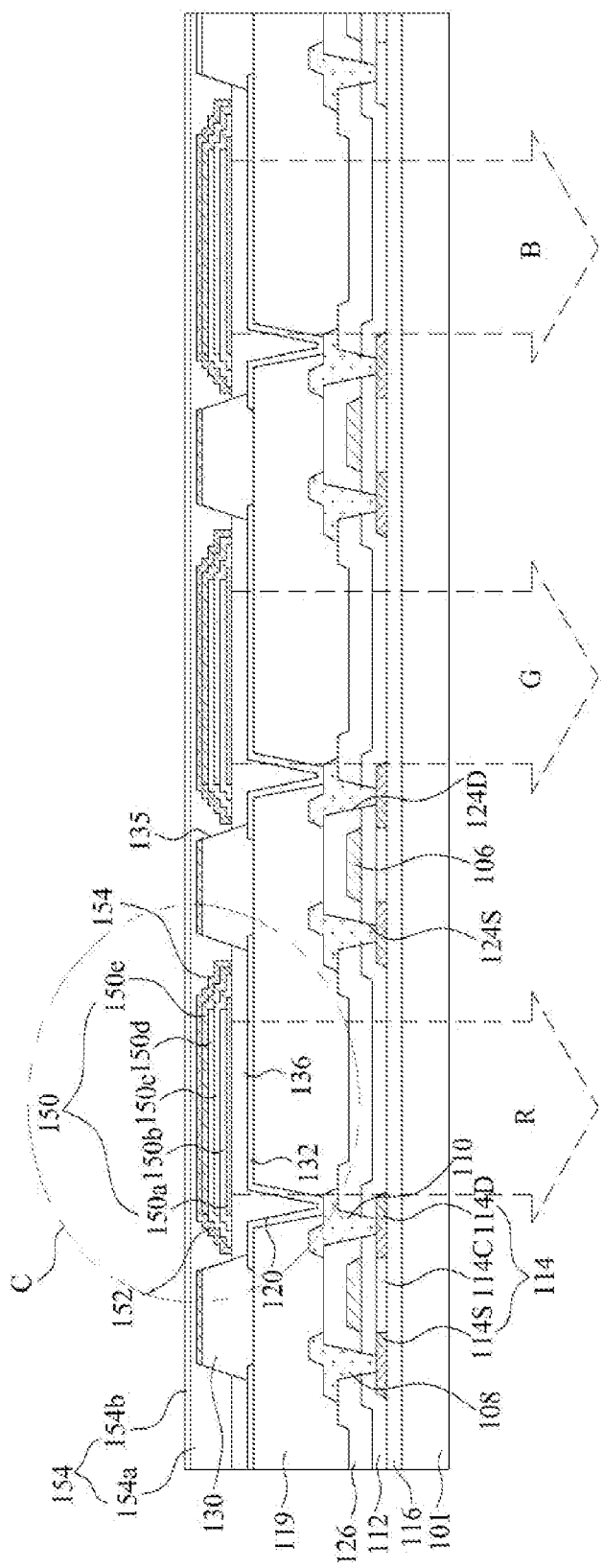
FIG. 3 illustrates a section of an organic electro-luminescence display panel with the R,G,B subpixel region in FIG. 2.
Figure 4:
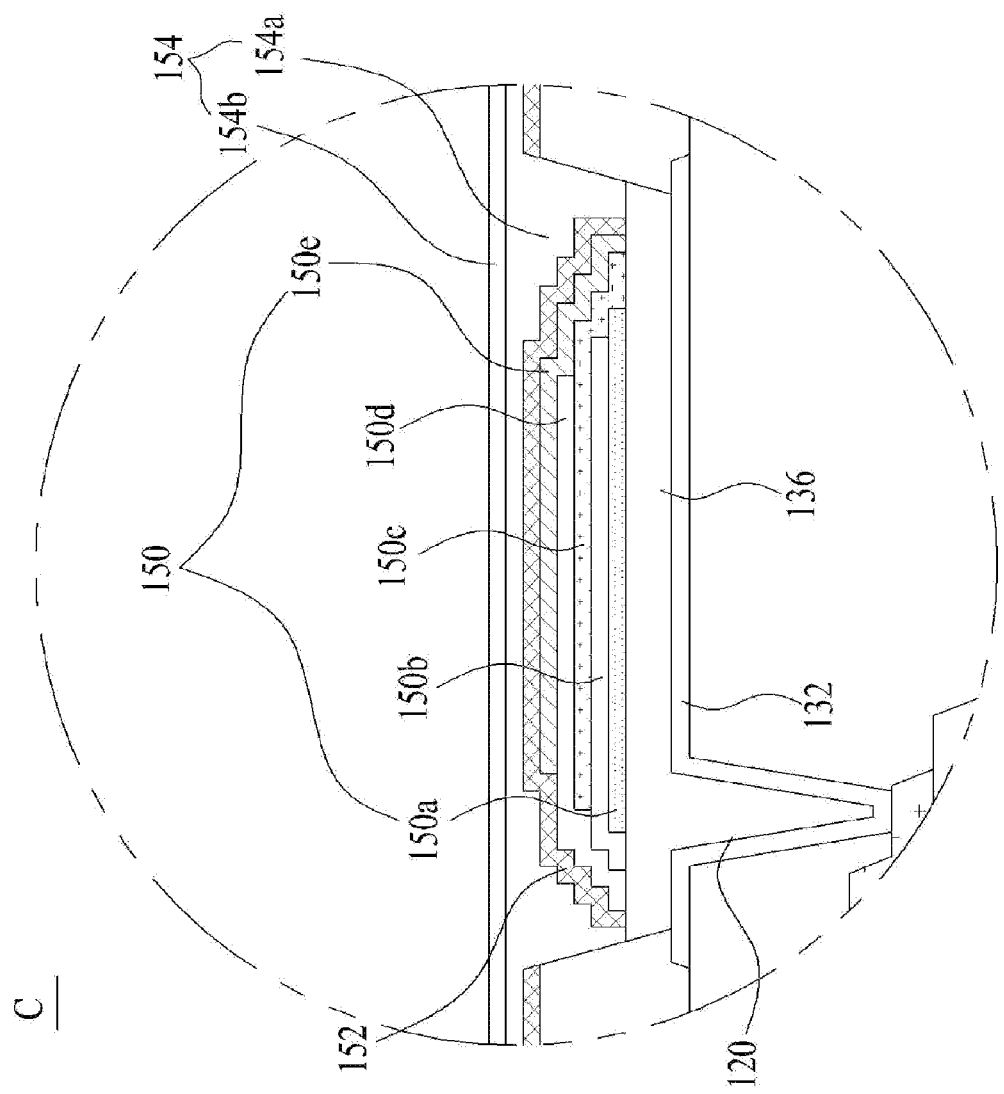
FIG. 4 illustrates an enlarged view of the organic electro-luminescence device in the organic electro-luminescence display panel in FIG. 3.

FIG. 2 illustrates an equivalent circuit of an R,G,B subpixel region in accordance with a preferred embodiment of the present invention, and FIG. 3 illustrates a section of an organic electro-luminescence display panel with the R,G,B subpixel region in FIG. 2. And, FIG. 4 illustrates an enlarged view of the organic electro-luminescence device in the organic electro-luminescence display panel in FIG. 3.

Referring to FIG. 2, the organic electro-luminescence display panel includes a plurality of pixel regions defined as gate lines GL, data lines DL, and power lines PL cross one another. Each of the pixel regions has an organic electro-luminescence device and a cell driver 200 for driving the organic electro-luminescence device.

The plurality of pixel regions has a Red subpixel region, a Green subpixel region, and a Blue subpixel region. The Red subpixel region, the Green subpixel region, and the Blue subpixel region are arranged in a matrix for displaying a picture.

The cell driver 200 includes a switch thin film transistor TS connected to the gate line GL and the data line DL, a drive thin film transistor TD connected between the switch thin film transistor TS, the power line PL and a first electrode 222 of the organic electro-luminescence device, and a storage capacitor C connected between the power line PL and a drain electrode 110 of the switch thin film transistor TS.

The switch thin film transistor TS has a gate electrode connected to the gate line GL, a source electrode connected to the data line DL, and a drain electrode connected to a gate electrode of the drive thin film transistor TD and a storage capacitor C. The drive thin film transistor TD has a source electrode connected to the power line PL, a drain electrode connected to the first electrode 222 of the organic electro-luminescence device. The storage capacitor C is connected between the power line PL and the gate electrode of the drive thin film transistor TD.

When a scan pulse is applied to the gate line GL, the switch drive thin film transistor TS is turned on for supplying a data signal from the data line DL to the storage capacitor C and the gate electrode of the drive thin film transistor TD. The drive thin film transistor TD controls a current I being supplied from the power line PL to the organic electro-luminescence device in response to the data signal supplied to the gate electrode for controlling a light emission of the organic electro-luminescence device. The drive thin film transistor TD also sustains the light emission of the organic electro-luminescence device by supplying a constant current I from the storage capacitor C even if the switch thin film transistor TS is turned off until the data signal of the next frame is supplied.

The drive thin film transistor TD will be described with FIG. 3. Referring to FIG. 3, a first buffer film 116 is formed on a substrate 101, and an active layer 114 is formed on the first buffer film 116 at each subpixel regions. The active layer 114 has source and drain regions 114S and 114D having $n^+$ impurities injection thereto, and a channel region 114C between the source and drain regions 114S and 114D. A gate insulating film 112 is formed on an entire surface of the substrate including the active layer 114. A gate electrode 106 is formed on the gate insulating film 112 over the channel region 114C of the active layer 114. An interlayer insulating film 126 is formed on the substrate including the gate electrode and has a source contact hole 124S and a drain contact hole 124D which pass through the interlayer insulating film 126 and the gate insulating film 112 to expose to the source and drain regions 114S and 114D. The source electrode 108 and the drain electrode 110 are formed on the interlayer insulating film. The source electrode 108 and the drain electrode 110 are respectively connected to the source region 114S and the drain region 114D of the active layer 114 through the source contact hole 124S and the drain contact hole 124D, respectively. And, the active layer 114 may further be provided with a lightly doped drain LDD region (Not shown) between the channel region 114c and the source and drain regions 114S and 114D having n impurities injected thereto for reducing a turn off current. Although described with respect to one type, the drive thin film transistor TD may be of a p-type or n-type in other embodiments.

An organic protective film 119 of an organic insulating material is formed on the substrate including the drive thin film transistor TD. Alternatively, the protective film may have two layers of an inorganic protective film of an inorganic material, and an organic protective film of an organic insulating film.

The organic electro-luminescence device will be described with FIGS. 3 and 4. Referring to FIGS. 3 and 4, a first electrode 132 is formed on the organic protective film 119 and connected to the drain electrode 110 of the drive thin film transistor TD. A bank insulating film 130 having a bank hole 135 exposing the first electrode 132 is formed on the substrate including the first electrode 132. A second buffer film 136 is formed on the first electrode 132. In one embodiment, the second buffer film 136 is made of an organic material. Organic common layers 150 constructed of a plurality of common layers 150a to 150e is formed on the second buffer film 136. A second electrode 152 is formed on the organic common layers 150 such that the second electrode envelops the organic common layers on at least three sides.

When voltage is applied between the first electrode 132 and the second electrode 152, an exciton is generated as an electron from the second electrode 152 and a hole is generated from the first electrode 132. Both the electron and hole are injected into a third common layer 150c (A light emission layer), and are re-coupled there. As a consequence, the organic electro-luminescence device emits light as the exciton drops to a ground state.

The first electrode 132, an anode, is formed of a transparent conductive material such as ITO (Indium Tin Oxide) and IZO (Indium Zinc Oxide), for example. Since the first electrode 132 is formed of the transparent conductive material, the light from the third common layer 150c (The light emitting layer) emits to the bottom surface through the first electrode 132. And, the second electrode 152, a cathode, may be formed of a reflective metal, such as aluminum Al. As shown in FIG. 3, though the present invention suggests bottom light emission, depending on materials of the first and second electrodes 132 and 152, a bottom, a front, or two side light emission may be possible.

The organic common layers 150 include first through fifth common layers 150a to 150e, and they have a stair shape on both side edges. A first common layer 150a is formed as a hole injection layer HIL, a second common layer 150b is formed as a hole transport layer HTL, a third common layer 150c is formed as a R,G,B emitting layer EML, a fourth common layer 150d is formed as an electron transport layer ETL, and a fifth common layer 150e is formed as an electron injection layer EIL. The third common layer 150c may be formed as either a Red emitting layer at the R subpixel region to emit a red light, a Green emitting layer at the G subpixel region to emit a green light, or a Blue emitting layer at the B subpixel region to emit a blue light. Other color emitting layers are also envisioned.

Referring to FIG. 4, the first common layer 150a is formed on the second buffer film 136, the second common layer has a right (or "inside") edge 150b-1 positioned a distance in a left direction from a right edge 150a-1 of the first common layer. The third common layer has a left edge (or "inside") 150c-2 positioned a distance in a right direction from the left side edge 150a-2 of the first common layer. The fourth common layer has a right edge 150d-1 positioned a distance in the left direction from the right edge 150a-1 of the first common layer. The fifth common layer has a left edge 150e-2 positioned a distance in the right direction from the left edge 150a-2 of the first common layer.

In this embodiment, the right edges 150b-1 and 150d-1 of the second and fourth common layers are positioned 10~50 μm, preferably 30 μm, in the left direction from the right edge 150a-1 of the first common layer. The left side edges 150c-2 and 150e-2 of the third and fifth common layers are positioned 10~50 μm, preferably 30 μm, in the right direction from the left edge 150a-2 of the first common layer. These edges are referred to as inside edges because they do not extend past the above mentioned edge of the first common layer (150a-1 or 150a-2 depending upon which organic common layer).

The left edge 150b-2 of the second common layer 150b is positioned to envelop the left edge 150a-2 of the first common layer 150a. The left edge 150b-2 extends 10~50 μm, preferably 30 μm, past the left edge 150a-2 of the first common layer 150a. The right edge 150c-1 of the third common layer 150c is positioned to envelop the right edges 150a-1 and 150b-1 of the first and second common layers 150a and 150b. The right edge 150c-1 extends 10~50 μm, preferably 30 μm, past the right edge 150a-1 of the first common layer 150a. The left edge 150d-2 of the fourth common layer 150d is positioned to envelop the left edges 150b-2 and 150c-2 of the second and third common layers 150b and 150c. The left edge 150-d extends 10~50 μm, preferably 30 μm, past the left edge 150b-2 of the second common layer 150b. The right edge 150e-1 of the fifth common layer 150e is positioned to enveloped the right edges 150c-1 and 150d-1 of the third and fourth common layers 150c and 150d. The right edge extends 10~50 μm, preferably 30 μm, past the right edge 150c-1 of the third common layer 150c.

The assignments of right and left positioning of the edges of the organic common layers is arbitrary, and may be reversed in other embodiments.

Thus, the organic common layers 150 are formed in different positions relative to one another to create a stair shape at the side edges. The formation of the stair shape at the edges of the organic common layers 150 enables even thickness stacking of the second electrode 152 on the organic common layers 150 when the second electrode 152 is deposited. Even thickness stacking causes the second electrode 152 to have a substantially consistent (or constant) thickness between the first and fifth common layers. For example, the thickness of the second electrode 152 is substantially the same on the side of the third common layer as it is on the side of the first, second, fourth, and fifth common layers. Even thickness stacking prevents degradation between the organic common layers 150 and the second electrode 152 from taking place.

Figure 5:
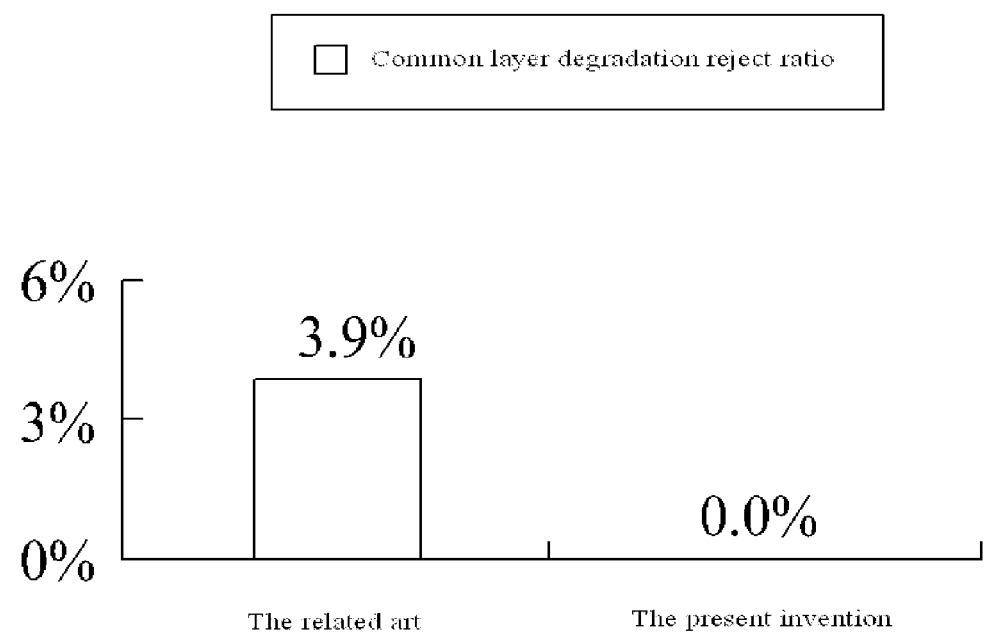
FIG. 5 illustrates a graph for comparing a degradation reject ratio of related art organic common layers and a degradation reject ratio of stair shaped organic common layers.

FIG. 5 illustrates a graph for comparing a degradation reject ratio of related art organic common layers 150 and a degradation reject ratio of stair shaped organic common layers of the present invention. Though the related art common layers HIL, HTL, EML, ETL, and EIL stacked at the same position in succession have an average 3.9% of degradation incident rate, the first to fifth common layers 150a to 150e stacked at different positions in stair shapes of the present invention have 0% of the degradation incident rate, i.e., disappeared.

Figure 1:
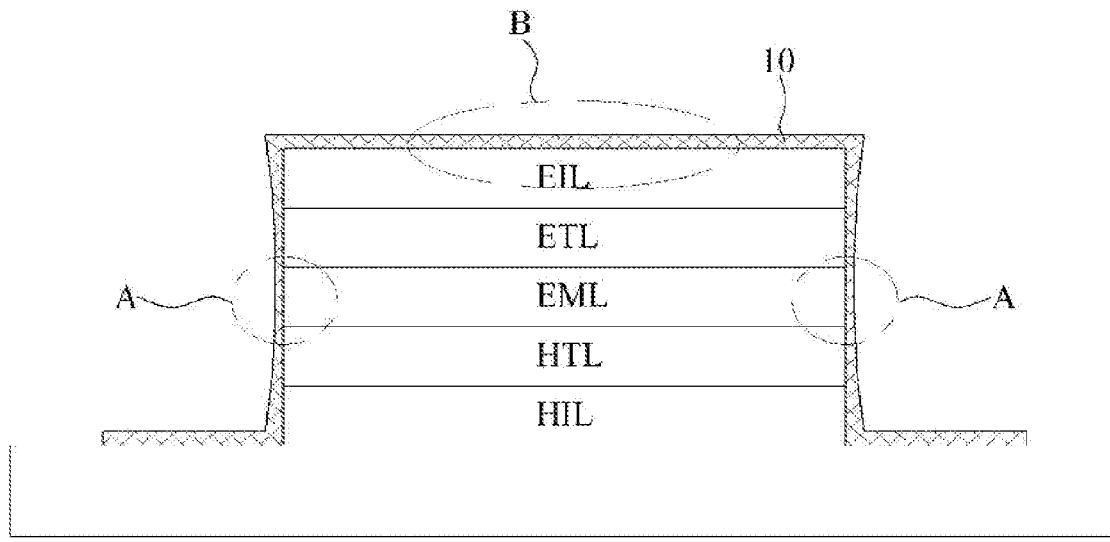
FIG. 1 illustrates a section of a conventional organic electro-luminescence device.

This may be explained as follows. The related art common layers HIL, HTL, EML, ETL, and EIL stacked at the same position in succession have the cathode 10 deposited unevenly. That is, as shown in FIG. 1, though the cathode 10 deposited on the front of the stack of the common layers HIL, HTL, EML, ETL, and EIL has an even thickness, the cathode 10 deposited on the sides of the stack of the common layers HIL, HTL, EML, ETL, and EIL is thin, failing to be deposited, properly. According to this, though the cathode 10 deposited on the front of the common layers HIL, HTL, EML, ETL, and EIL has an even thickness, the cathode 10 deposited on the sides of the common layers HIL, HTL, EML, ETL, and EIL is thin, varying the thickness with positions. As the thickness of the cathode varies with the positions, the degradation takes place. That is, since the thickness of the cathode deposited on the sides of the related art common layers HIL, HTL, EML, ETL, and EIL is thinner than the thickness of the cathode deposited on the front of the common layers HIL, HTL, EML, ETL, and EIL, making resistance at the side higher, the degradation takes place, accordingly.

However, the organic common layers 150 of the present invention have the plurality of common layers 150a to 150e stacked in the stair shapes with different stacking positions, making even deposition of the cathode (or second electrode) _152 on the sides. According to this, since the thickness of the cathode 152 deposited on the front of the organic common layers 150 and the thickness of the cathode 152 deposited on the sides of the organic common layers 150 are even, no degradation takes place.

A capping layer 154 has at least two layers for preventing moisture and oxygen from infiltrating, and, as shown in FIG. 3, the capping layer 154 may be formed of an inorganic film 154a and an organic film 154b, or a plurality of the inorganic films 154a and the organic films 154b.

FIGS. 6A through 6H illustrate sections showing the steps of a method for fabricating an organic electro-luminescence display panel in accordance with the embodiment of the present invention shown in FIG. 3.

Figure 6A:
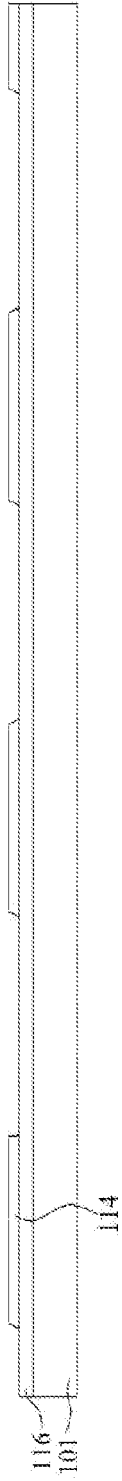

Referring to FIG. 6A, a first buffer film 116 is formed on an entire surface of the substrate 101, and a plurality of active layers 114 are formed on the buffer film 116 over each sub-pixel region.

In detail, the first buffer film 116 is formed of an inorganic insulating material, such as $SiO_2$ on an entire surface of the substrate 101 by deposition, such as CVD, and PECVD (Plasma Enhanced Chemical Vapor Deposition). An amorphous silicon layer is formed on the first buffer film 116, and the amorphous silicon layer is crystallized with a laser beam to turn the amorphous silicon layer into a polysilicon layer. The active layer 114 is formed on the first buffer film 116 by selectively etching the polysilicon layer using photolithography with a first mask. A dehydrogenation step may be performed additionally for removing hydrogen atoms from the amorphous silicon film before laser crystallization.

Figure 6B:
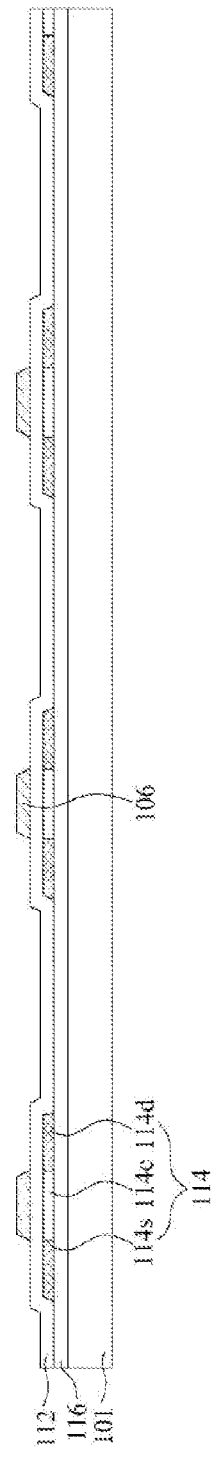

Referring to FIG. 6B, a gate insulating film 112 is formed of an inorganic insulating material, such as $SiO_2$, on an entire surface of the first buffer film 116 having the active layer 114 by PECVD or CVD. Then, a gate metal layer is formed on the gate insulating film 112 by deposition, such as sputtering. The gate metal layer is single layer, or double layer of molybdenum Mo, aluminum Al, or chrome Cr, or an alloy thereof.

Then, the gate metal layer is patterned by photolithography and etching, to form the gate electrode 106.

And, $n^+$ impurity is implanted into the active layer 114 by using the gate electrode 106 as a mask, to form $n^+$ impurity doped source and drain regions 114S and 114D and a channel region 114C in the active layer.

Figure 6C:
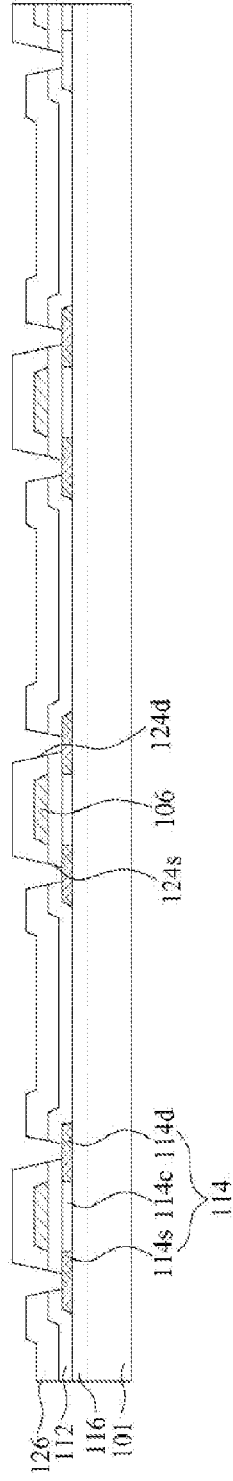

Referring to FIG. 6C, an interlayer insulating film 126 is formed of an inorganic insulating material, such as silicon oxide and silicon nitride, on an entire surface of the gate insulating film 112 having the gate electrode 106 formed thereon by PECVD or CVD. Then, the source and drain contact holes 124S and 124D are formed to pass through the gate insulating film 112 and the interlayer insulating film 126 by photolithography and etching with a third mask. The source and drain contact holes 124S and 124D expose the source and drain regions 114S, and 114D, or 214S and 214D, respectively.

Referring to FIG. 6D, source and drain electrodes 108 and 110 are formed on the interlayer insulating film 126 formed thereon.

In detail, a source and drain metal layer is deposited on the interlayer insulating film 126 by, such as sputtering, and subjected to patterning by photolithography and etching with a fourth mask, to form the source electrode 108 and the drain electrode 110. The source electrode 108 and the drain electrode 110 are in contact with the source region 114s and the drain region 114D in the active layer 114 through the source and drain contact holes 124S and 124D, respectively.

Referring to FIG. 6E, a protective film 119 having a pixel contact hole 120 is formed on the substrate 101 having the source and drain electrodes 108 and 110 formed thereon.

In detail, the protective film 119 is formed on the substrate 101 having the source and drain electrodes 108 formed thereon by PECVD or CVD. The protective film 119 may be formed of an inorganic insulating material, or an organic insulating material, or two layers of the inorganic insulating material and the organic insulating material. The protective film 119 is patterned by photolithography and etching with a fifth mask to form the pixel contact hole 120 passed through the protective film 119. The pixel contact hole 120 exposes the drain electrode 110.

Referring to FIG. 6F, a first electrode 132 of an organic electro-luminescence device in direct contact with the drain electrode 110 of a drive thin film transistor TD is formed.

In detail, a transparent conductive electrode layer is formed by deposition, such as sputtering, of a transparent conductive material, such as TCO (Transparent Conductive Oxide), ITO (Indium Tin Oxide) and IZO (Indium Zinc Oxide), on the protective film 119, and patterned by photolithography and etching with a sixth mask, to form the first electrode 132.

Referring to FIG. 6G, a bank insulating film 130 having a bank hole 135 is formed on the substrate 101 having the first electrode 132 formed thereon.

In detail, an organic insulating material, such as an acryl group resin, is coated on an entire surface of the substrate 101 having the first electrode 132 formed thereon by spinless or spin coating, and patterned by photolithography and etching with a seventh mask, to expose the first electrode 132 passed through the bank insulating film 130 to form the bank hole 135.

Figure 6H:
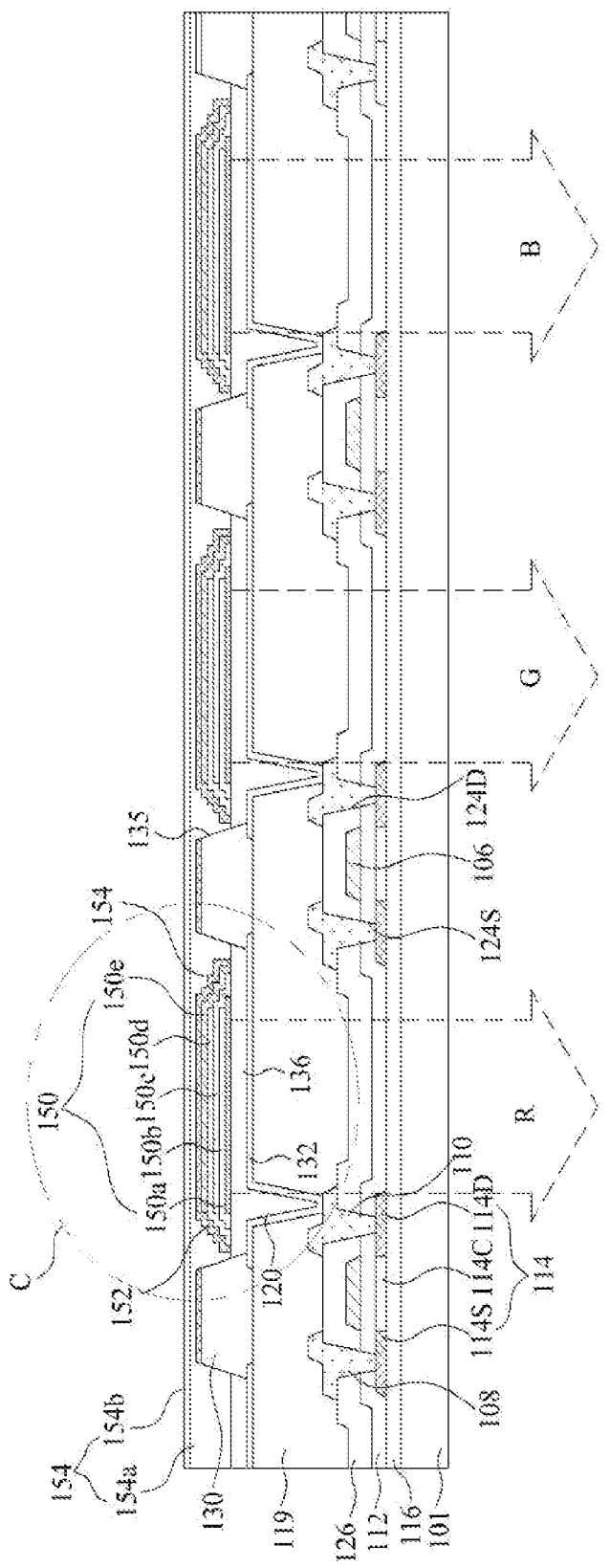

Referring to FIG. 6H, a second buffer film 136, organic common layers 150 having a plurality of common layers 150a to 150e, and a second electrode 152 are formed on the first electrode 132.

Figure 7A:
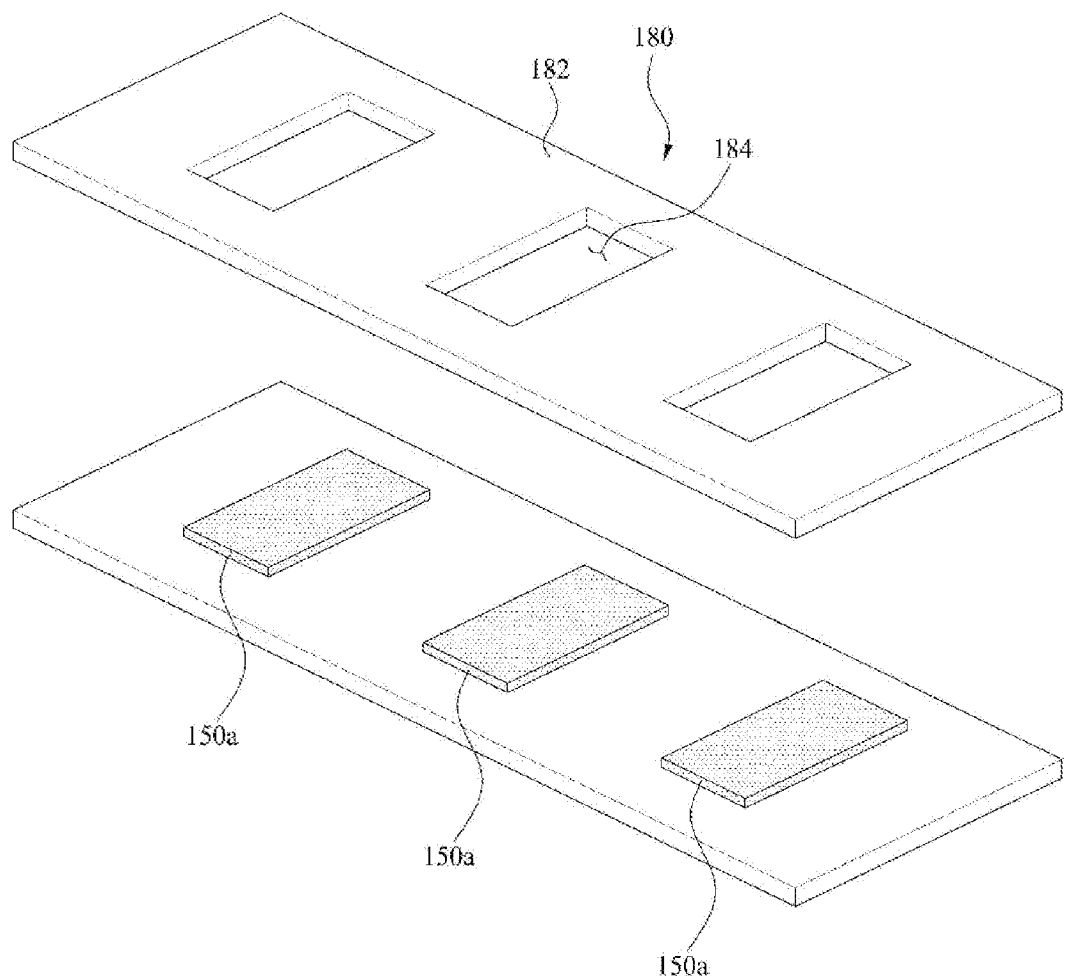
FIGS. 7A through 7E illustrate perspective views for describing a method for forming the organic common layers, according to one embodiment.

In detail, the second buffer film 136 is formed in the bank hole 135, and the first to fifth common layers 150a to 150e are stacked in succession on the second buffer film 136 with a shadow mask, to form the organic common layers 150. As shown in FIG. 7A, the shadow mask 180 includes a plurality of openings matched to respective sizes of the pixel regions (e.g., the sizes of the organic common layers to be formed) for enabling a depositing material to pass therethrough at the time of deposition, and a shielding region 182 for shielding the depositing material at the time of deposition. A method for forming the first to fifth common layers 150a to 150e will be described, with reference to FIGS. 7A to 7E.

FIGS. 7A-7E illustrate perspective views for describing a method for forming the organic common layers, according to one embodiment.

Figure 7B:
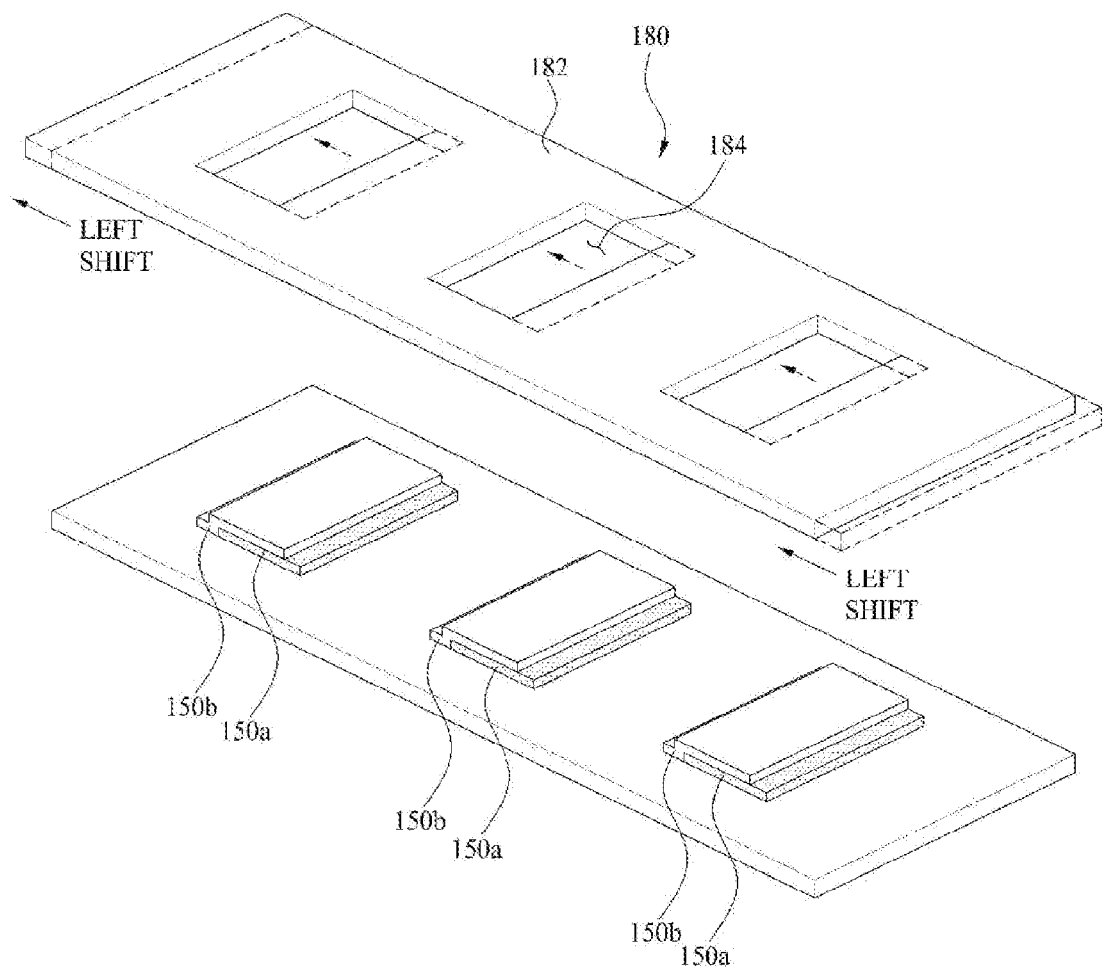

Referring to FIG. 7A, a first common layer 150a is formed on the first electrode 132 through the opening 184 of shadow mask 180. A second common layer 150b is formed on the first common layer 150a using shadow mask 180. As shown in FIG. 7B, the shadow mask 180 is shifted by 10 μm ~50 μm in a left direction (e.g., a first direction) with respect to the position of the first common layer 150a. This distance may be measured, for example, from the side edges of the openings 184 in the shadow mask 180. The second common layer 150b is formed on the first common layer 150a through the opening 184 in the shadow mask 180. The second common layer 150b formed on the first common layer 150a is shifted in the left direction relative to the first common layer 150a.

Figure 7C:
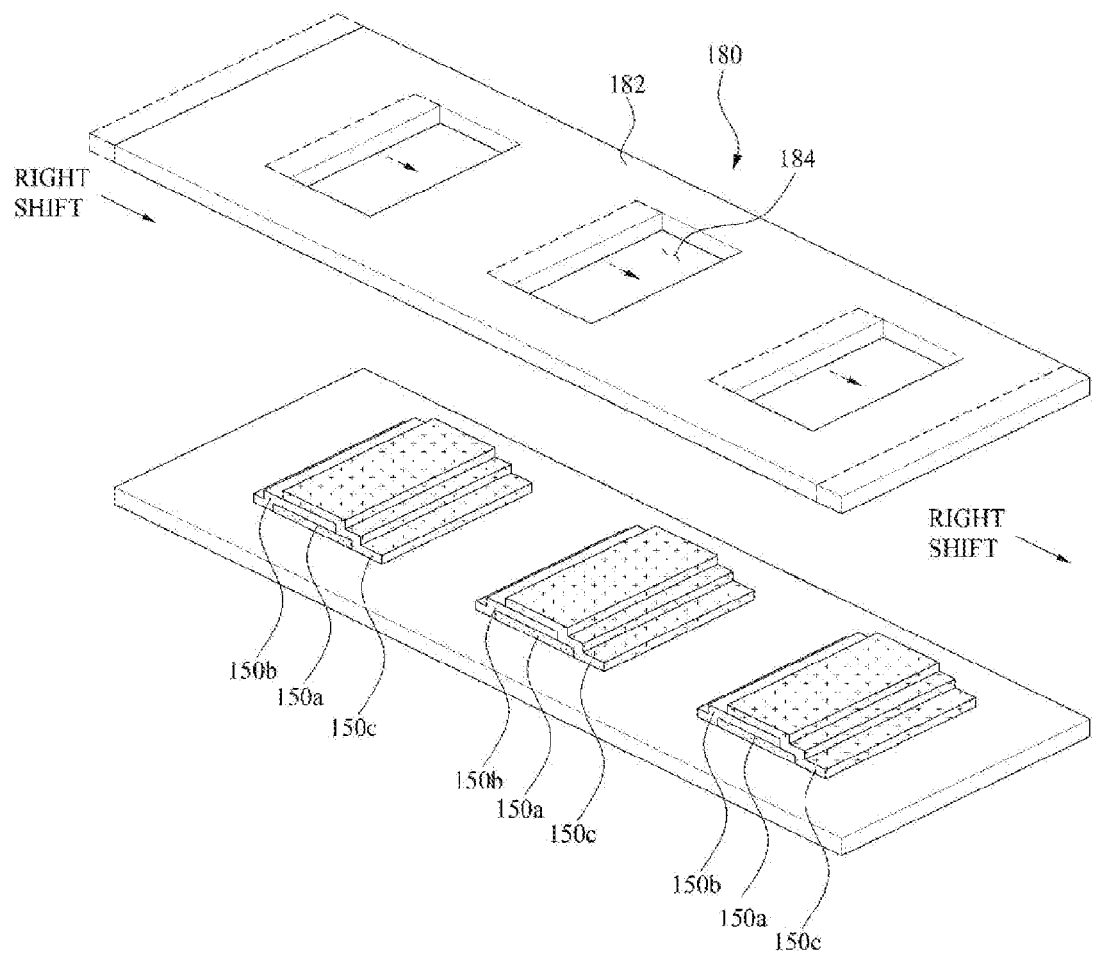

A third common layer 150c is formed on the second common layer 150b using the same shadow mask 180. As shown in FIG. 7C, the shadow mask 180 is shifted by 10 μm ~50 μm in a right direction (e.g., in a second direction) with respect to the position of the first common layer 150a. The third common layer 150c is formed on the first and second common layers through the opening 184 in the shadow mask 180. The third common layer 150c formed on the first and second common layers is shifted in the right direction relative to the first common layer 150a.

Figure 7D:
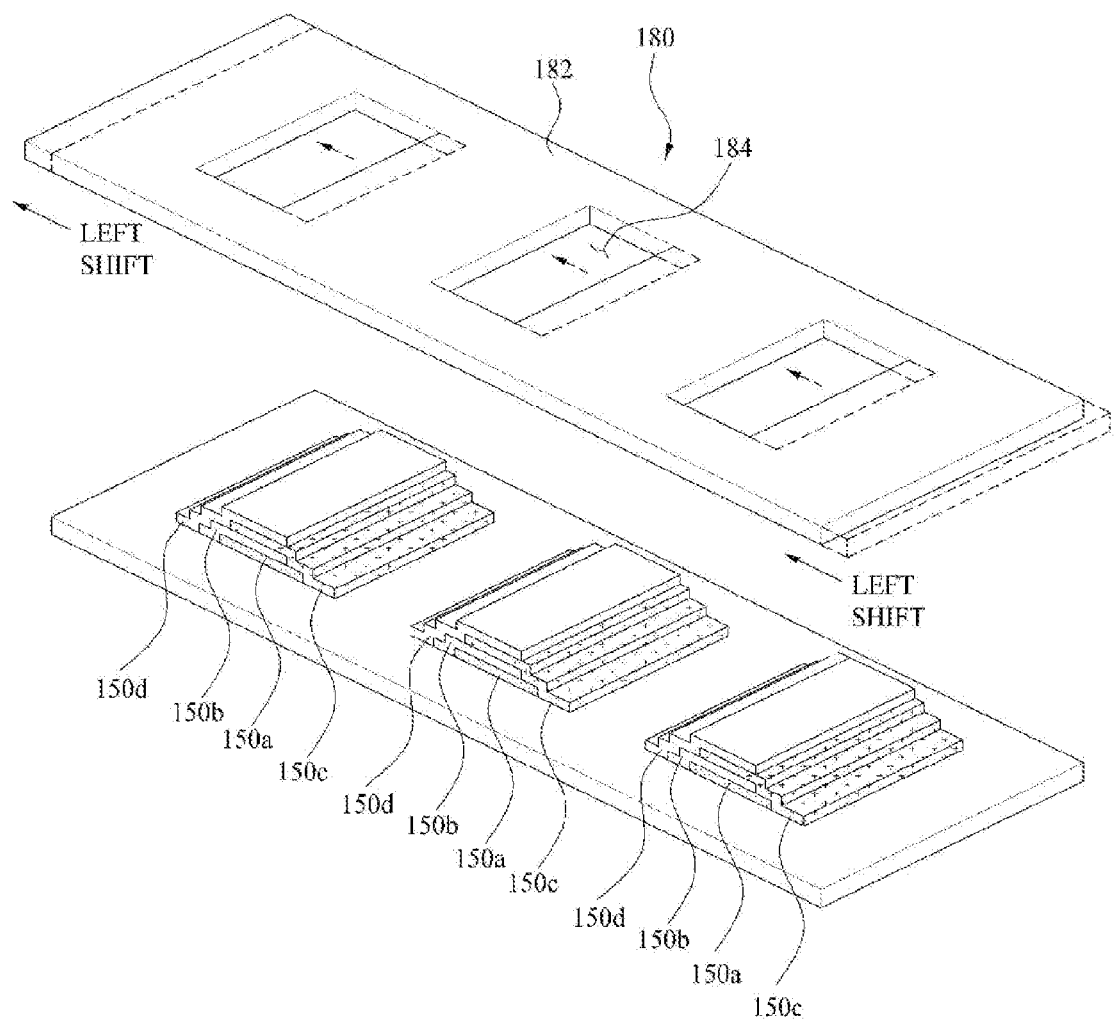

A fourth common layer 150d is formed on the third common layer 150c using the same shadow mask 180. As shown in FIG. 7D, the shadow mask 180 is shifted by 10 μm~50 μm in the left direction with respect to the position of first common layer 150a. The fourth common layer 150d is formed on the second and third common layers 150c through the opening 184 in the shadow mask 180. The fourth common layer 150d formed on the second and third common layers 150c is shifted in the left direction relative to the first common layer 150a.

Figure 7E:
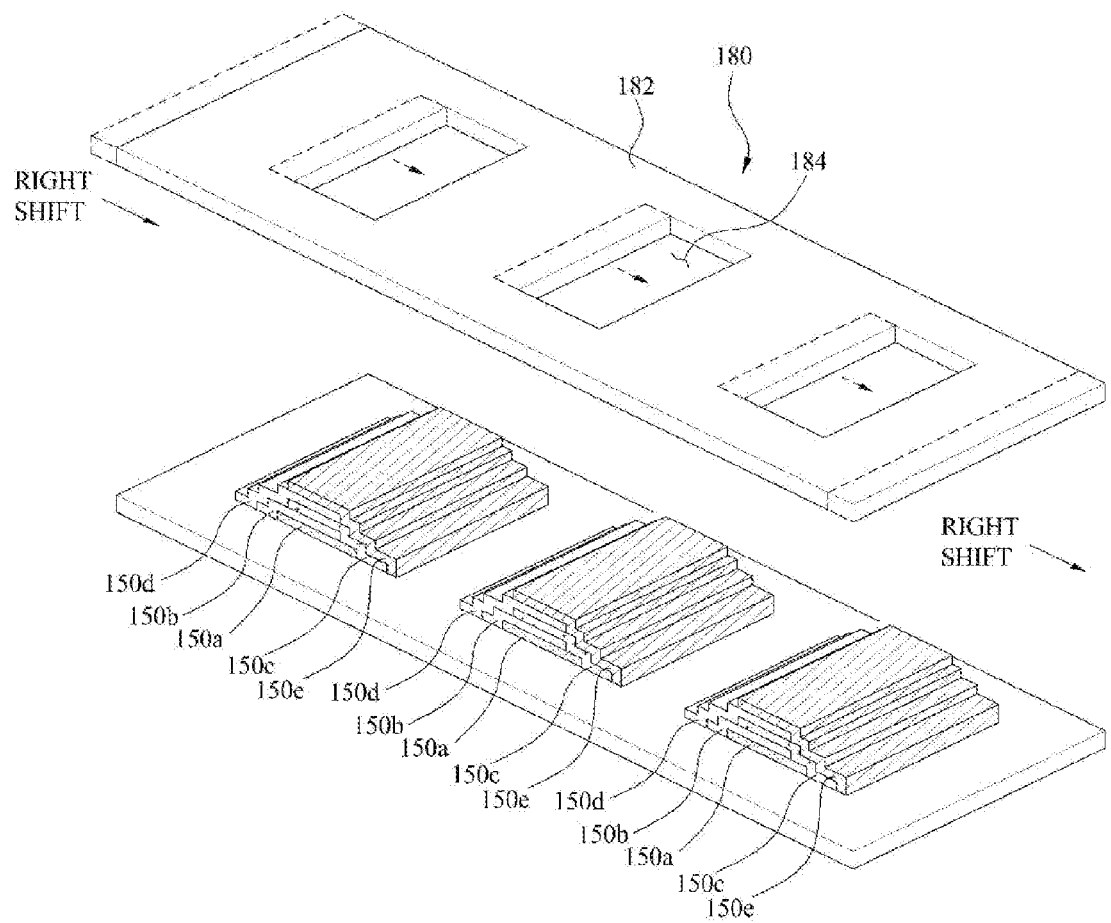

A fifth common layer 150e is formed on the fourth common layer 150d using the same shadow mask 180. As shown in FIG. 7E, the shadow mask 180 is shifted by 10 μm ~50 μm in the right direction with respect to the position of the first common layer 150a. The fifth common layer 150e is formed on the third and fourth common layers through the opening 184 in the shadow mask 180. The fifth common layer 150e formed on the third and fourth common layers 150d is shifted in the right direction relative to the first common layer 150a.

As above, the choice of left or right with respect to the layering of the organic common layers is arbitrary, and may be reversed in another embodiment.

The first common layer 150a is formed on the second buffer film 136. After the formation of the organic common layers, a second electrode 152 of a material having high reflectivity, such as aluminum Al, and a capping layer 154 is deposited on the substrate 101 having the organic common layers 150 formed thereon, thereby enveloping the organic common layers. In one embodiment, this is accomplished by depositing on the entire surface of the substrate having the organic common layers 150. The capping layer 154 is formed by deposition, such as CVD and PECVD (Plasma Enhanced Chemical Vapor Deposition), of an inorganic film 154a, such as a silicon nitride film, a silicon oxide film, a metal or a metal oxide film, and an organic film 154b of acrylate and the like on an entire surface of the second electrode 152.

Second Embodiment

The first embodiment illustrates an embodiment where the organic common layers are formed so as to be separate and distinct for each subpixel region. However, the present invention is not limited to this particular construction. In other embodiments, one or more of the organic common layers may be formed so as to extend across more than one subpixel region.

Figure 8:
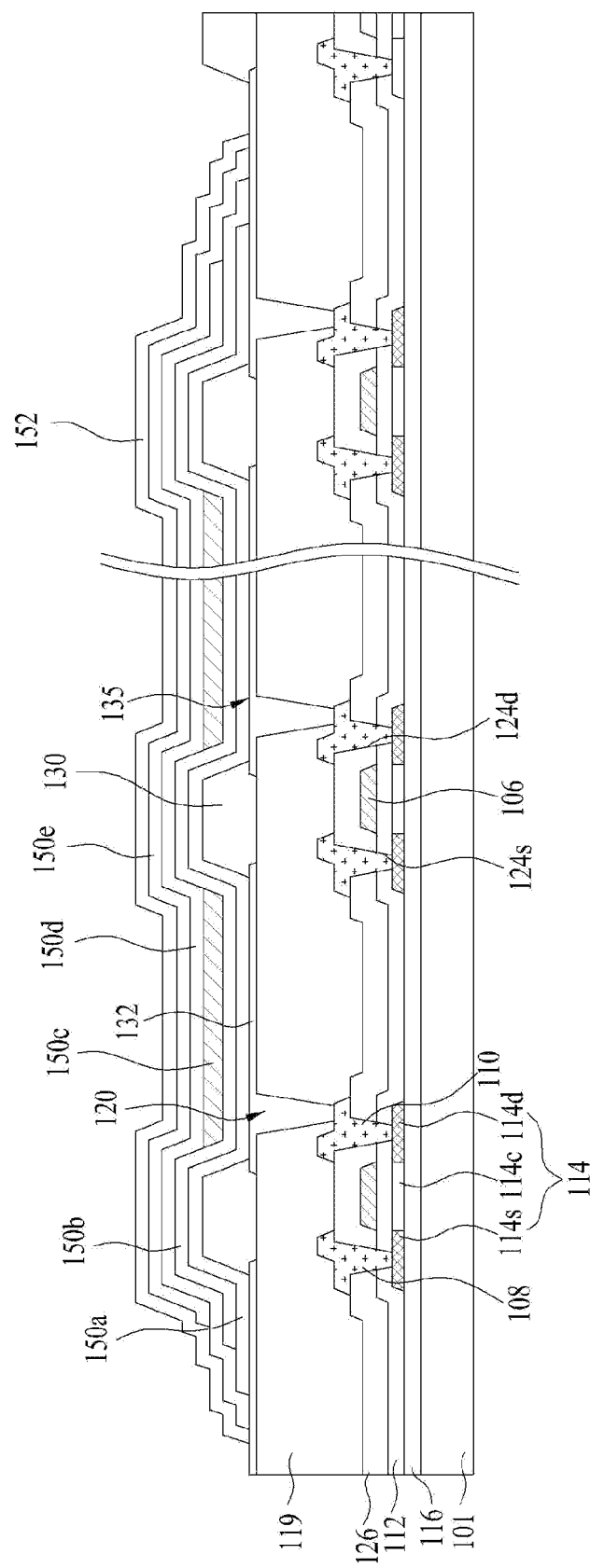
FIG. 8 is a cross-sectional view of an organic electro-luminescence display panel in accordance with a second embodiment.

FIG. 8 is a cross-sectional view of an organic electroluminescence display panel in accordance with a second embodiment. In the second embodiment, four of five total organic common layers 150 are common to more than one subpixel region, and the middle organic common layer, the EML or third organic common layer 150c, is formed so as to be separate and distinct for each subpixel. As a result, the EML for each subpixel may be differently designed so as to emit a different color of light (e.g., Red, Green, and Blue).

In this embodiment, in each pixel, a first electrode 132 is connected to a drain electrode 110 of a driving thin film transistor TD. The first electrode 132 is formed on a protective film 119. A back insulating film 130 having a bank hole 135 that exposes the first electrode 132 is formed on the front surface of each pixel, as shown in FIGS. 3 and 4. As above, the panel includes organic common layers 150a-e that are formed on the first electrodes 132 of the respective pixels. A second electrode 152, common to multiple pixels, is formed on the top organic common layer 150.

The organic common layers 150 include first to fifth common layers 150a to 150e, and are formed in a stair shape. As above, a hole injection layer (HIL) is formed as the first common layer 150a, a hole transport layer (HTL) is formed as the second common layer 150b, an R, G and B light emission layer (EML) is formed as the third common layer 150c, an electron transport layer (ETL) is formed as the fourth common layer 150d, and an electron injection layer (EIL) is formed as the fifth common layer 150e.

The first, second, fourth and fifth common layers 150a, 150b, 150d and 150e are formed so as to be common across multiple pixel (and/or subpixel) regions on the front surface of the panel. In contrast to the first embodiment, the third common layer 150c is separately formed at each of the respective pixel regions. As a result, the third common layer 150c may serve as a red light emission layer for R subpixel regions to emit red light, as a green light emission layer for G subpixel regions to emit green light, or as a blue light emission layer for B subpixel regions to emit blue light.

A left side edge of the second common layer 150b is formed at a position shifted in the right direction from the left side edge of the first common layer 150a by a distance of 10~50 μm (preferably, 30 μm). The third common layer 150c is formed on the second common layer 150b in each subpixel region. The right side edge of the fourth common layer 150d is formed at a position shifted in the left direction from the right side edge of the first common layer 150a by a distance of 10~50 μm (preferably, 30 μm). The left side edge of the fifth common layer 150e is formed at a position shifted in the right direction from the left side edge of the second common layer 150b by a distance of 10~50 μm (preferably, 30 μm).

Both side surfaces of the organic common layers 150 are stair-shaped by the different positions of the left and right side edges of the first, second, fourth and fifth common layers 150a, 150b, 150d and 150e, as described above. Formation of stair-shaped side edges of the organic common layers 150 allows the second electrode 152 to be deposited on the organic common layers 150 to a uniform thickness. A second electrode 152 with a more uniform thickness reduces the occurrence of degradation between the organic common layers 150 and the second electrode 152.

A method for forming the organic common layers 150 in the second embodiment is similar to the method described with reference to FIGS. 6A to 6H and FIGS. 7A to 7E, except that two different shadow masks may be used to create the organic common layers. A first mask (not shown) may be used to create the first, second, fourth, and fifth organic common layers. A second mask 180 (e.g., the same shadow mask as depicted in FIG. 7), with openings 184 formed at positions corresponding to subpixel regions, may be used to generate the third organic common layer.

Third Embodiment

Similarly to the second embodiment, the third embodiment is another case where one or more of the organic common layers may be formed to extend across more than one subpixel region.

Figure 9:
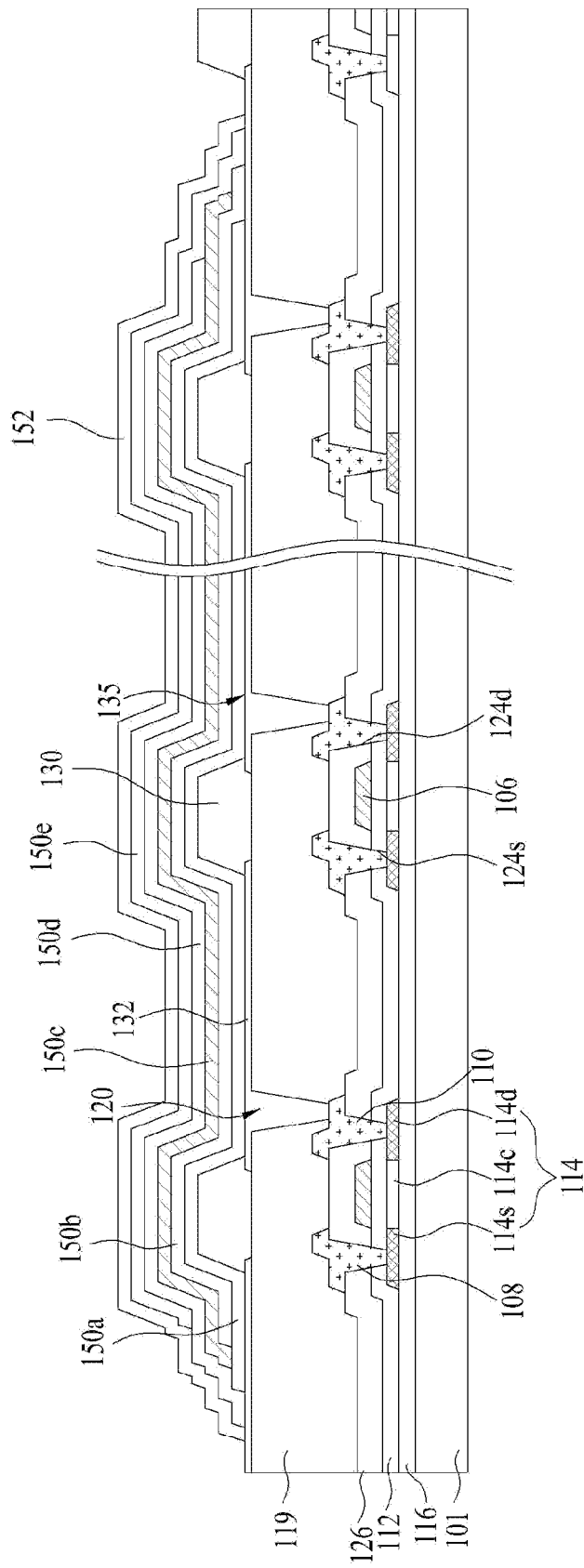
FIG. 9 is a cross-sectional view of an organic electro-luminescence display panel in accordance with a third embodiment.

FIG. 9 is a cross-sectional view of a monochrome organic electro-luminescence display panel in accordance with a third embodiment. In the third embodiment, again in each pixel a first electrode 132 is connected to a drain electrode 110 of a driving thin film transistor TD. The first electrode is formed on a protective film 119. A back insulating film 130 having a bank hole 135 exposing the first electrode 132 is formed on the front surface of each pixel, as shown in FIGS. 3 and 4. As above, the panel includes organic common layers 150a-e that are formed on the first electrodes 132 of the respective pixels. A second electrode 152, common to multiple pixels, is formed on the top organic common layer 150.

The organic common layers 150 include first to fifth common layers 150a to 150e that are formed in a stair shape. As above, a hole injection layer (HIL) is formed as the first common layer 150a, a hole transport layer (HTL) is formed as the second common layer 150b, a single color light emission layer (EML) is formed as the third common layer 150c, an electron transport layer (ETL) is formed as the fourth common layer 150d, and an electron injection layer (EIL) is formed as the fifth common layer 150e.

In this embodiment, all five common layers 150a, 150b, 150c, 150d and 150e are formed in common across subpixel regions on the front surface of the panel.

A left side edge of the second common layer 150b is located at a position shifted in the right direction from a left side edge of the first common layer 150a by a distance of 10~50 μm (preferably, 30 μm) in the right direction. The third common layer 150c is located between the left side edge of the first common layer 150a and the right side edge of the second common layer 150b. In this example, the left side edge of the third organic envelops the left side edge of the second organic common layer 150b, but does not envelop the left side edge of the first organic common layer 150a. The right side edge of the third organic common layer 150 does not extend past the right side edge of the second organic common layer. The right side edge of the fourth common layer 150d is located at a position shifted in the left direction from the right side edge of the first common layer 150a by a distance of 10~50 μm (preferably, 30 μm). The left side edge of the fifth common layer 150e is located at a position shifted in the right direction from the left side edge of the second common layer 150b by a distance of 10~50 μm (preferably, 30 μm).

As the third organic common layer 150c is common to multiple subpixels, color differentiation is not achieved using this common layer. Instead, a display created using this embodiment may be a black and white display. Alternatively, individual green, blue, and red subpixels may be created by adding a filter to each subpixel between the third organic common layer and the front surface of the display panel. In one embodiment, the filters are added between the substrate 101 and the front surface of the display panel.

Both side surfaces of the organic common layers 150 are stair-shaped by the different positions of the left and right side edges of the first, second, fourth and fifth common layers 150a, 150b, 150d and 150e, as described above. Formation of stair-shaped side edges of the organic common layers 150 allows the second electrode 152 to be deposited on the organic common layers 150 to a uniform thickness. A second electrode 152 with a more uniform thickness reduces the occurrence of degradation between the organic common layers 150 and the second electrode 152.

A method for forming the organic common layers 150 in the third embodiment is similar to the method described with reference to FIGS. 6A to 6H and FIGS. 7A to 7E, except that the shadow mask used to create the organic common layers has an opening 184 that extends across multiple pixel and/or pixel regions. In one embodiment, the mask opening 184 is large enough to form organic common layers for all pixels of the display panel simultaneously.

Fourth Embodiment

Figure 10:
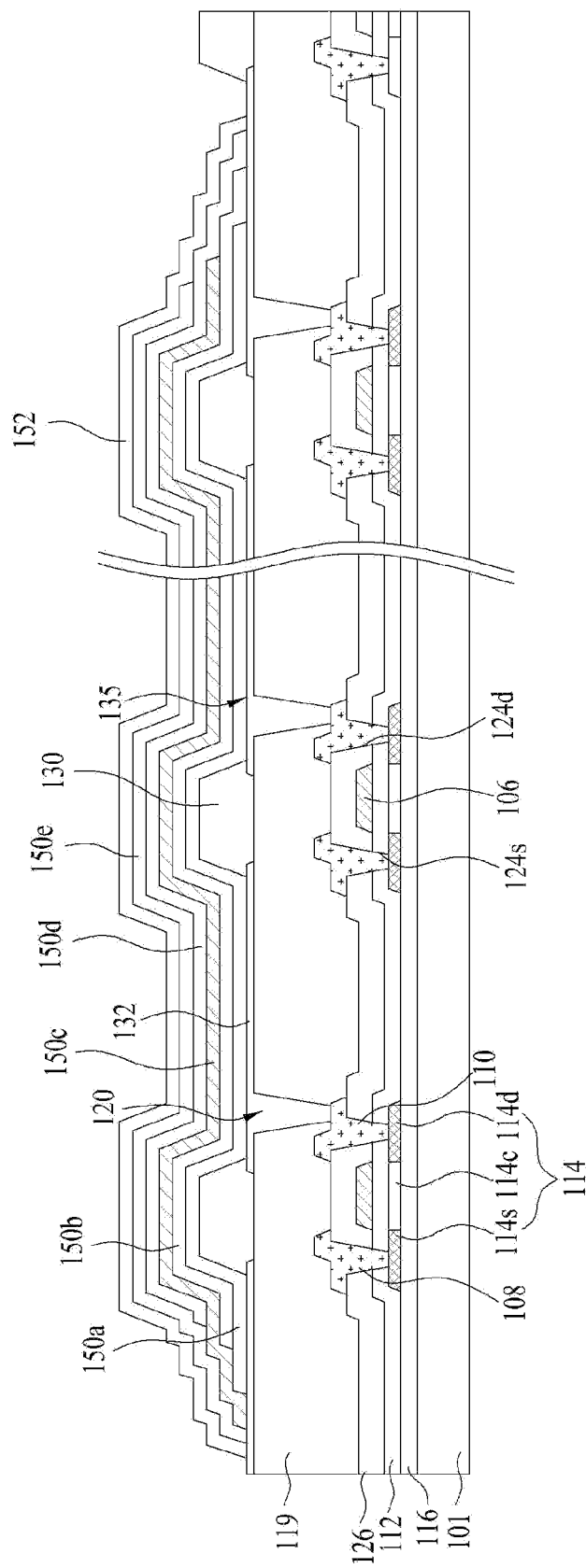
FIG. 10 is a cross-sectional view of an organic electro-luminescence display panel in accordance with a fourth embodiment.

The third embodiment describes the third common layer 150c, i.e., the light emission layer, as having side edges that do not extend past the side edges of the organic common layer below it. A fourth embodiment is the same as the third embodiment, except that at least one side edge of the third organic common layer 150c extends past a side edge of the organic common layer beneath it. FIG. 10 is a cross-sectional view of a monochrome organic electro-luminescence display panel in accordance with the fourth embodiment.

Fifth Embodiment

The first through fourth embodiments illustrate the organic common layers as being formed such each layer's side edges overlap the sides edges of the previous layer in an alternating fashion, such that one side edge overlaps the previous layer and the other side edge does not. In contrast, in the fifth embodiment, all sides edges on one side (e.g., the left side) do not overlap the previous layer's side edges, and all side edges on the other side (e.g., the right side) overlap the previous layer's side edges. Other embodiments with different patterns of overlap are also envisioned. Regardless of the patterning of overlap of the side edges, the stair shape of the organic common layers is maintained so that the second electrode 152 has relatively uniform thickness at all layers.

Figure 11:
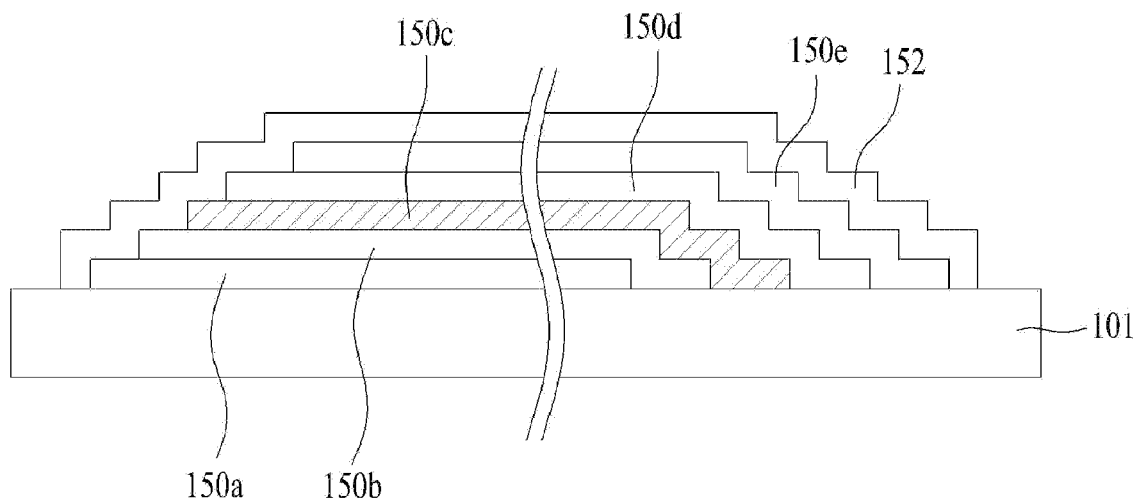
FIG. 11 is a cross-sectional view of a organic electro-luminescence display panel in accordance with one embodiment.

FIG. 11 is a cross-sectional view of a monochrome organic electro-luminescence display panel in accordance with a fifth embodiment. Although FIG. 11 illustrates the first to fifth common layers 150a~150e as being sequentially shifted in the right direction, the reverse is also possible. That is, the first to fifth common layers 150a~150e may be sequentially shifted in the left direction instead.

Additional Considerations

As described above, the organic electro-luminescence display panel has a plurality of organic common layers stacked at different stacking positions to have stair shaped both sides, to form the both sides moderately. As a result, the cathode deposited on the organic common layers has even thickness on a front and both sides thereof. The even thickness of the cathode on the front and both sides thereof makes cathode resistance the same, thereby preventing degradation from taking place. The organic electro-luminescence device without the degradation permits to improve a lifetime and brightness of the device.

It will be apparent to those skilled in the art that various modifications and variations can be made without departing from the spirit or scope of the invention. Thus, it is intended that the present invention covers the modifications and variations of this invention provided they come within the scope of the appended cfflaims and their equivalents.

What is claimed is:

1. An organic electro-luminescence device (OLED) comprising:
    a first electrode formed on a substrate;
    a plurality of organic common layers formed over the substrate, the organic common layers having a plurality of side edges, the side edges from the organic common layers together forming a stair shape; and
    a second electrode formed on the organic common layers, the second electrode enveloping the side edges of the organic common layers, the second electrode comprising a substantially constant thickness on the side edges of each organic common layer.

2. The OLED of claim 1 wherein each of the organic common layers envelopes at least one side edge of a previous organic common layer formed under said each of the organic common layers.

3. The OLED of claim 1 wherein a buffer film is formed on the substrate, and the plurality of organic common layers are formed on the buffer film.

4. The OLED of claim 1 wherein a side edge of an organic common layer extends a distance past a side edge of a previous organic common layer formed under said organic common layer but above the first organic common layer.

5. The OLED of claim 4 wherein the distance is 10 to 50 μm.

6. The OLED of claim 4 wherein the distance is 30 μm.

7. The OLED of claim 1 wherein a first side edge of an organic common layer extends a distance past an inside edge of a subsequent organic common layer formed above the organic common layer.

8. The OLED of claim 1 wherein the organic common layers include at least:
    a first organic common layer;
    a second organic common layer formed on the first organic common layer;
    a third organic common layer formed on the second organic common layer;
    a fourth organic common layer formed on the third organic common layer; and
    a fifth organic common layer formed on the fourth organic common layer,
    wherein first side edges of each of the second and the fourth organic common layers extend past a first side edge of the first organic common layer.

9. The OLED of claim 8, wherein a second side edge of the first organic common layer extends past second side edges of each of the second and the fourth organic common layers.

10. The OLED of claim 8 wherein the first side edge of the first organic common layer extends past first inside edges of each of the third and the fifth organic common layers and wherein second side edges of each of the third and the fifth organic common layers extend past a second side edge of the first organic common layer.

11. The OLED of claim 1 wherein the stair shape formed by the organic common layers is contained within a single subpixel region.

12. The OLED of claim 1 wherein the stair shape formed by the organic common layers extends across a plurality of subpixel regions.

13. The OLED of claim 12 wherein one of the organic common layers is a light emitting layer, and the light emitting layer is contained within each subpixel region.

14. The OLED of claim 12 wherein one of the organic common layers is a light emitting layer, and the light emitting layer extends across a plurality of subpixel regions.

15. The OLED of claim 1 wherein the side edges on a first side of the organic common layers each envelop the side edge of the layer beneath, and wherein the side edges on a second side of the organic common layers each extend past the side edge of the layer above.

16. A method for creating an organic electro-luminescence device (OLED) comprising:
    forming a first electrode on a substrate;
    forming a plurality of organic common layers over the substrate with a shadow mask, the organic common layers having a plurality of side edges, the side edges from the organic common layers together forming a stair shape; and
    forming a second electrode on the organic common layers, the second electrode enveloping the side edges of at least some of the organic common layers, the second electrode comprising a substantially constant thickness on the side edges of each organic common layer.

17. The method of claim 16 wherein forming a plurality of organic common layers comprises:
    forming a first organic common layer over the substrate;
    shifting the shadow mask so a first edge of the shadow mask is repositioned to the first side of a first side edge of the first organic common layer;
    forming a second organic common layer enveloping the first side edge of the first organic common layer;
    shifting the shadow mask so a second edge of the shadow mask is repositioned to a second side of a second side edge of the first and second organic common layers;
    forming a third organic common layer enveloping the second side edges of the first and second organic common layers;
    shifting the shadow mask so the first edge of the shadow mask is repositioned to the first side of a first side edge of the second and third organic common layers;
    forming a fourth organic common layer enveloping the first side edges of the second and third organic common layers;
    shifting the shadow mask so the second edge of the shadow mask is repositioned to the second side of a second side edge of the third and fourth organic common layers; and
    forming a fifth organic common layer enveloping the second side edges of the third and fourth organic common layers.

18. A method for creating an organic electro-luminescence device (OLED) comprising:
    forming a first electrode on a substrate;
    forming a plurality of organic common layers over the substrate with a first shadow mask, the organic common layers having a plurality of side edges, the side edges from the organic common layers together forming a stair shape; and
    forming a light emitting layer over the substrate with a second shadow mask, the light emitting layer formed between the organic common layers;
    forming a second electrode on the organic common layers, the second electrode enveloping the side edges of at least some of the organic common layers, the second electrode comprising a substantially constant thickness on the side edges of each organic common layer.

* * * * *